United States Patent
Kothamasu et al.

(10) Patent No.: US 10,387,690 B2
(45) Date of Patent: Aug. 20, 2019

(54) INTEGRATED POWER SUPPLY SCHEME FOR POWERING MEMORY CARD HOST INTERFACE

(71) Applicant: TEXAS INSTRUMENTS INCORPORATED, Dallas, TX (US)

(72) Inventors: Siva Srinivas Kothamasu, Allen, TX (US); Haydar Bilhan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 60 days.

(21) Appl. No.: 15/493,973

(22) Filed: Apr. 21, 2017

(65) Prior Publication Data

US 2017/0308724 A1 Oct. 26, 2017

Related U.S. Application Data

(60) Provisional application No. 62/325,767, filed on Apr. 21, 2016.

(51) Int. Cl.
*G06K 7/00* (2006.01)
*G06F 1/26* (2006.01)
*G11C 5/14* (2006.01)

(52) U.S. Cl.
CPC ............ *G06K 7/0013* (2013.01); *G06F 1/26* (2013.01); *G11C 5/14* (2013.01); *G11C 5/147* (2013.01)

(58) Field of Classification Search
CPC .. G06K 19/00; G06K 19/06; G06K 19/07722; G06F 17/00
USPC ........................ 235/488, 487, 375
See application file for complete search history.

(56) References Cited

U.S. PATENT DOCUMENTS

| | | | | |
|---|---|---|---|---|
| 2005/0040885 A1* | 2/2005 | Hayashi | ............... | G05F 3/30 327/543 |
| 2006/0151614 A1* | 7/2006 | Nishizawa | ............ | G06K 19/077 235/492 |
| 2007/0263332 A1* | 11/2007 | Apfel | ................. | H02H 9/041 361/90 |
| 2012/0318875 A1* | 12/2012 | Cho | ................... | G06K 19/0723 235/492 |
| 2013/0108088 A1* | 5/2013 | Jensen | ................. | H04R 25/505 381/312 |
| 2015/0171858 A1* | 6/2015 | Matsuoka | ........... | H03K 3/35613 327/109 |
| 2016/0026207 A1* | 1/2016 | Boling | ................ | H01L 29/7851 327/537 |
| 2017/0184642 A1* | 6/2017 | Menard | ............ | G05B 19/0428 |

* cited by examiner

*Primary Examiner* — Edwyn Labaze
(74) *Attorney, Agent, or Firm* — Kenneth Liu; Charles A. Brill; Frank D. Cimino

(57) ABSTRACT

This invention is an SOC with an integrated single rail power supply that interfaces with the host controller and dynamically changes the host interface supply to 3.3 volts or 1.8 volts based on the sensed card speed grade. The SOC initially selects 3.3 volts to supply to the memory card. The SOC communicates with memory card vis input/output circuits to determine a memory type. The controller selects a 3.3 volt or 1.8 volt supply for the memory card based upon the determination. The SOC powers the input/output circuits at the same supply voltage as the memory card. This invention employs 1.8 volt transistors in the input/output circuits using a bias voltage to protect these transistor from the full 3.3 volt power when the memory card is powered to 3.3 volts.

19 Claims, 3 Drawing Sheets

INTEGRATED POWER SUPPLY SCHEME FOR POWERING MEMORY CARD HOST INTERFACE

CLAIM OF PRIORITY

This application claims priority under 35 U.S.C. 119(e)(1) to U.S. Provisional Application No. 62/325,767 filed Apr. 21, 2016.

TECHNICAL FIELD OF THE INVENTION

The technical field of this invention is power supplied by a System On Chip (SOC) circuit to a SD memory card capable of operating at differing voltages.

BACKGROUND OF THE INVENTION

This invention is preferably a power supply from a System on Chip (SOC) to a secure digital (SD) memory card embodied in a standard UHS-1 card interface. These SD memory cards come in several standard voltage/frequency ratings. It is advantageous for the SOC to be able to operate with any connected SD memory card and be capable of changing the supplied power supply voltage based upon the memory card requirements.

The UHS-1 memory card interface permits these operating modes:

TABLE 1

| Mode | Name | Voltage | Speed (MHz) |
| --- | --- | --- | --- |
| DS | Default Speed | 3.3 | 25 |
| HS | High Speed | 3.3 | 50 |
| SDR12 | Single Data Rate | 1.8 | 25 |
| SDR25 | Single Data Rate | 1.8 | 50 |
| SDR50 | Single Data Rate | 1.8 | 100 |
| SDR105 | Single Data Rate | 1.8 | 208 |
| DDR50 | Dual Data Rate | 1.8 | 50 |

FIG. 1 illustrates a simplified view of the UHS-1 standard manner of the SOC selecting the voltage and data rate for the SD memory card. Program 100 begins with detection of SD memory card insertion in decision block 101. This detection generally triggers an interrupt to service the card interface. If a card insertion is not detected (No at decision block 101), then the system returns to decision block 101 and continues to wait for detection of SD memory card insertion. If card insertion is detected, (Yes at decision block 101), then the system supplies 3.3 volt power to the SD memory card at block 102.

The SOC and the SD memory card then communicate to set the voltage and speed of the interface (block 103). The result is determined by the SOC is a communications mode including supply voltage and frequency. This typically occurs by the SOC transmitting a series of commands to the SD memory card and making a communications mode decision bases upon the SD memory card responses. The interface frequency is not relevant to this invention and is not illustrated.

Relevant to this invention is the determined supply voltage for the SD memory card. Decision block 104 determines if the selected voltage for the SD memory card is 3.3 volts or 1.8 volts. If the determined power supply voltage is 3.3 volts, then program continues with other processing at continue block 105. If the determined power supply is 1.8 volts, then block 106 changes the electric power supplied to the SD memory card to 1.8 volts. Then program continues with other processing at continue block 105.

The prior art employed a separate power supply module between the SOC and the SD memory card. This separate power supply module required a separate power rail and an interface to the SOC to control the supplied voltage. This involves a separate control bus (typically an I²C bus) and programming in the SOC to control the power supply module via this separate bus. This introduces additional overhead in code and time delay in the power supply control operation. This also presents problems in the input/output (I/O) of the SOC to the SD memory card. If the SOC uses a low geometry process which does not support 3.3V transistors, this prior art requires an additional supply rail to create an intermediate bias of the SOC I/O circuits.

SUMMARY OF THE INVENTION

This invention is an SOC with an integrated single rail power supply that interfaces with the host controller and changes the host interface supply to 3.3 volts or 1.8 volts based on the sensed SD memory card speed grade. This invention works with a Dual-Voltage I/O (input/output) with a 1.8 volts bias.

This invention eliminates the need for an additional power supply rail and a custom power supply module requiring additional system bill of materials and an additional interface. This invention supports a 1.8 volt/3.3 volt dual-voltage I/O utilizing only 1.8 volt transistors via a bias voltage. This invention provides tighter integration between the SD memory card and the host controller. This inventions enables flexible power up/down sequence when switching SD memory card voltages. This invention employs 1.8 volt transistors in the I/O circuits using a bias voltage when the SD memory card is powered to 3.3 volts thereby reducing SOC cost by not requiring thick oxide for these transistors.

BRIEF DESCRIPTION OF THE DRAWINGS

These and other aspects of this invention are illustrated in the drawings, in which.

DETAILED DESCRIPTION OF PREFERRED EMBODIMENTS

In this invention the power supply for the SD memory card is embodied on the same integrated circuit as the SOC. The power supply includes a low drop out (LDO) voltage regulator to generate a 1.8 volt supply signal from a 3.3 volt supply applied to the SOC. This LDO voltage regulator supplies power to the SD memory card when the determined parameters indicate the SD memory card should be powered with a 1.8 volt supply. The LDO voltage regulator also supplies power to the SOC I/O (input/output) circuits. When the I/O circuits must interface with 3.3 volt circuits, the LDO voltage regulator supplies a bias voltage to prevent I/O circuit transistors from experiencing the entire 3.3 volt power supply when the SD memory card is powered at 3.3 volts.

Figure 2:
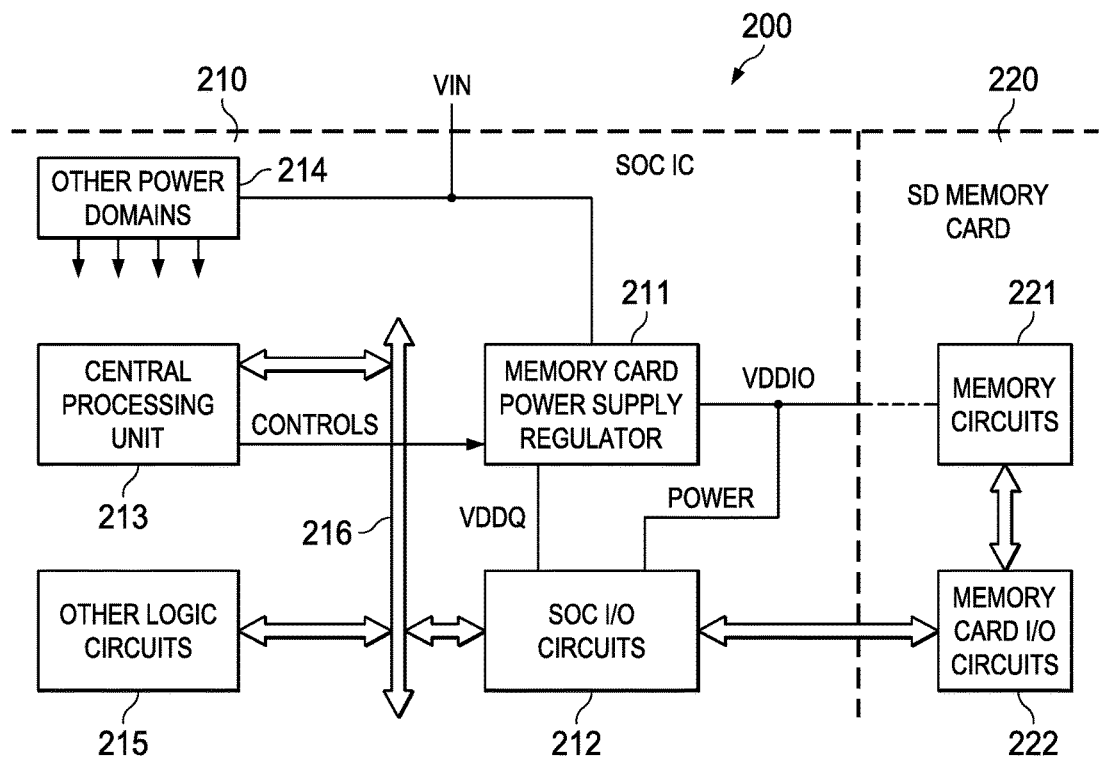
FIG. 2 illustrates how the SOC connects to the memory card.

FIG. 2 illustrates how the SOC connects to the SD memory card. System 200 includes the SOC integrated circuit 210 and the SD memory card 220. SOC integrated circuit 210 includes: memory card power supply regulator 211; SOC I/O circuits 212; central processing unit 213; other power domains 214; other logic circuits 215; and main bus 216. SD memory card 220 includes: memory circuits 221; and memory card I/O circuits 222.

SOC IC 210 receives an external power supply voltage VIN. VIN powers memory card power supply regulator 211 in a manner that is the subject of this invention. VIN powers other power domains 214 in a conventional manner. Other power domains 214 supplies power to various parts of SOC IC 210 in a conventional manner known in the art. This portion of SOC IC 210 is not relevant to the current invention and will not be further described.

Memory card power regulator 211 generates a power supply VDDIO supplied to both SD memory card 220 and SOC I/O circuits 212. Internal power supply connection within SD memory card 220 is only outlined in FIG. 2 and is conventional. Internal power supply within SOC I/O circuits 212 is different but also conventional. This will be further explained below.

Figure 1:
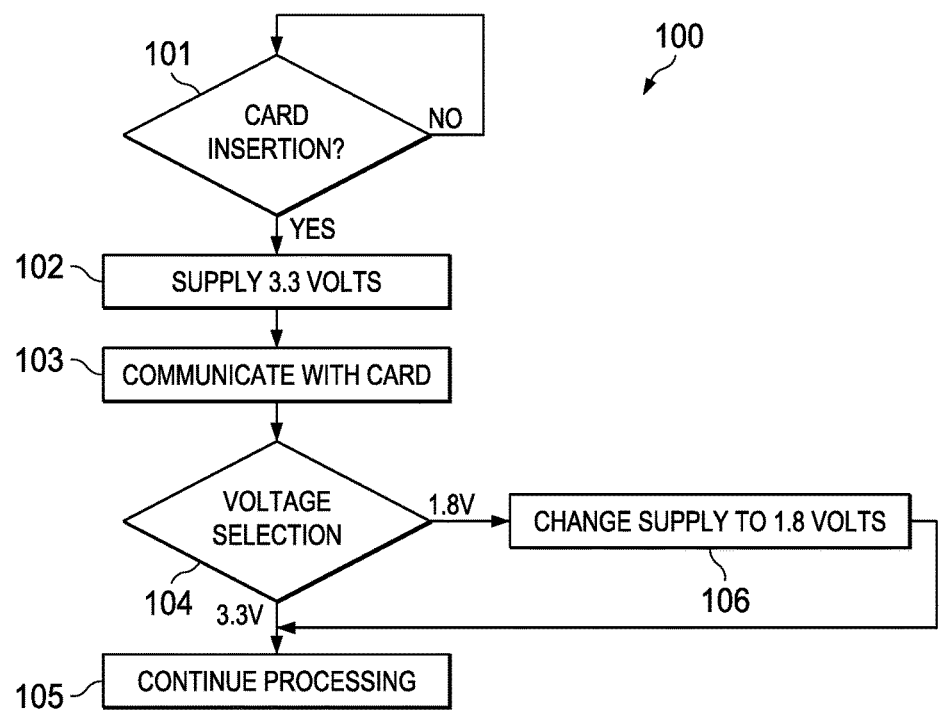
FIG. 1 illustrates a standard manner of the SOC selecting the voltage and data rate for the memory card.

As previously described SOC IC 210 is constructed to operate with a variety of SD memory card 220s having differing voltage and speed requirements. Upon initial connection of a SD memory card 220 to SOC IC 210, central processing unit 213 participates in a negotiation as illustrated in FIG. 1 via SOC I/O circuits 212 to determine the power and frequency needs of the recently connected SD memory card 220. Initially SOC IC 210 supplies 3.3 volts power to SD memory card 220. Central processing unit 213 supplies control signals to memory card power supply regulator 211 to produce a 3.3 volt supply to SD memory card 220. Based upon the determination of memory type, SOC IC 210 may continue to supply 3.3 volt power or may switch to 1.8 volt power. Central processing unit 213 controls any power voltage switch via the controls supplied to memory card power supply regulator 211. SOC I/O circuits 213 are powered by the same power voltage as supplied to SD memory card 210. SOC I/O circuits 213 also receives a power supply VDDQ from memory card power supply regulator 211 used in a manner further described below.

Figure 3:
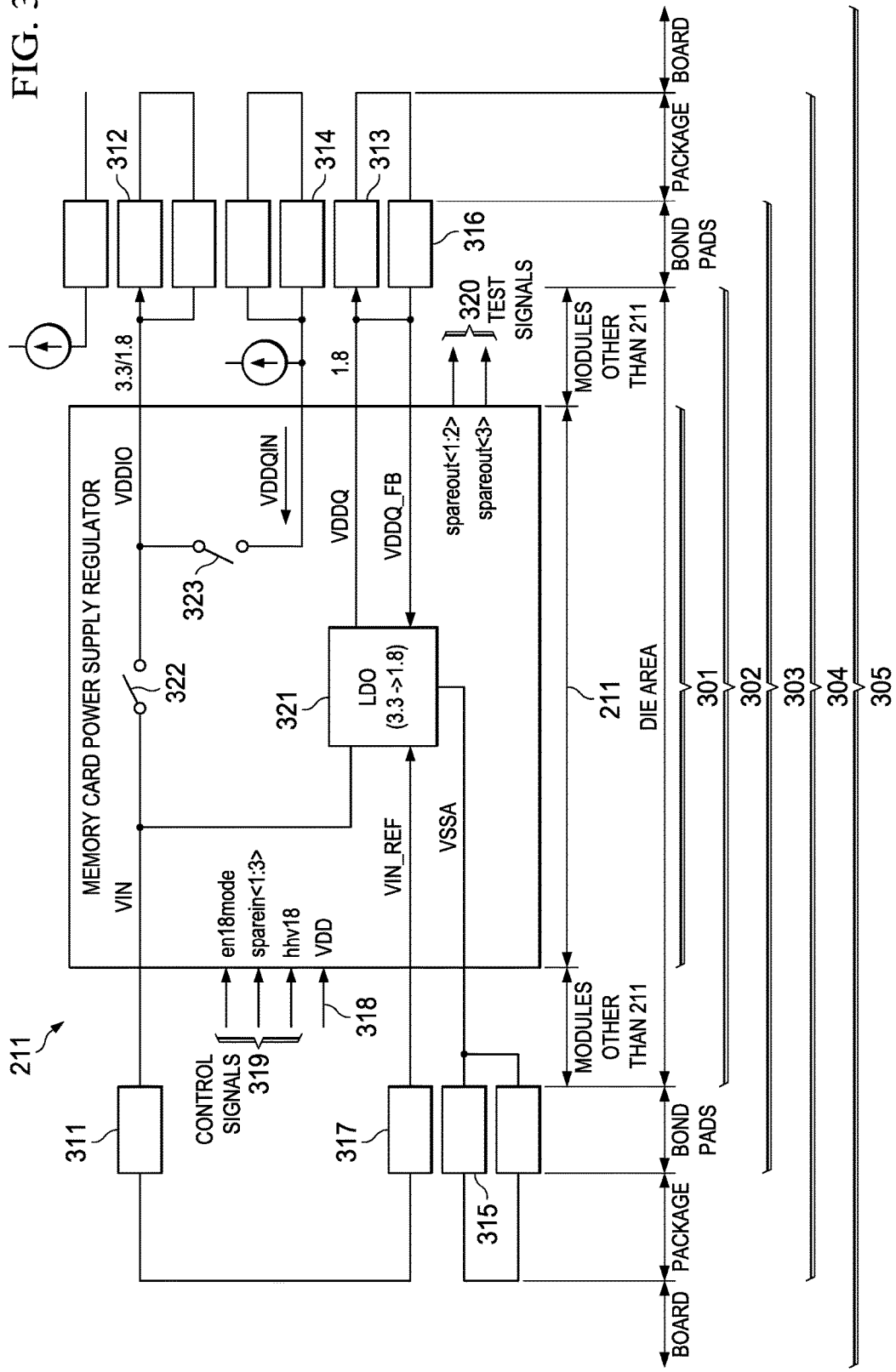
FIG. 3 illustrates details of the memory card power supply regulator.

FIG. 3 illustrates further details of memory card power supply regulator 211. FIG. 3 illustrates plural circuit domains. The first domain 301 is the part of SOC IC 210 that includes memory card power supply regulator 211. The second domain 302 includes the semiconductor part of SOC IC 210 including such parts as SOC I/O circuits 212, central processing unit 213 and other logic circuits 215. This domain is also known as the die area. The third domain 303 further includes the bond pads which enable connection between the die area (third domain 303) and external circuits. The fourth domain 304 is the package including SOC IC 210. The fifth domain 305 is a printed circuit board including other parts of the electronic system. These other parts include SD memory card 220 if connected.

FIG. 3 further illustrates relevant IC pins connected to bonding pads. These include: pin 311, receiving an external 3.3 volt power supply; pin 312, supplying a selected voltage signal (3.3 volts or 1.8 volts) to both SD memory card 220 (external) and SOC I/O circuits 211 (internal); pin 313, the output from LDO power supply 321; pin 314, a first feedback signal from the LDO power supply 321 output, generally pins 313 and 314 are tied together; pin 315, an analog ground input; pin 316, a second feedback signal from the LDO power supply 321 output; and pin 317, the voltage reference for LDO power supply 321, generally the same as VIN, the power supply voltage. FIG. 3 illustrates several signals internal to SOC IC 210 including: core domain power VDD 318; control signals 319 en18mode and hhv18; and test signals 320.

Table 2 shows a listing of the integrated circuit pins for SOC IC 210 of this invention.

TABLE 2

| Pin Name | Number | Domain | Description | In/Out |
|---|---|---|---|---|
| VIN | 311 | 3.3 | 3.3 volt external power supply | Input |
| VDDIO | 312 | VIN/VDDQ | 3.3 volt/1.8 volt supply for IOs | Output |
| VDDQ | 313 | 1.8 | 1.8 LDO output, I/O bias supply | Output |
| VDDQIN | 314 | 1.8 | LDO feedback signal from VDDQ chip pin | Input |
| VSSA | 315 | 0.0 | Analog ground | Input |
| VDDQ_FB | 316 | 1.8 | Shorted to VDDQ pad inside IC | Input |
| VIN_REF | 317 | 3.3 | Shorted to VIN inside IC | Input |
| VDD | 318 | 1.0 | Core domain power supply | Input |
| en18mode | 319 | core (1.0) | Control to switch VDDIO between 3.3 and 1.8 | Input |
| hhv18 | 319 | 1.8 | HHV signal | Input |

These signals are as follows. The VIN pin 311 receives a fixed 3.3 volt external power supply. The VDDQ pin 313 supplies a fixed 1.8 volt LDO (low drop out) output from LDO power supply 321. The VDDIO pin 312 can input either VIN or 1.8 volts. During start up, VDDIO 312 will be at VIN as long as hhv18 is high (1.8 volts). When hhv18 goes low, VDDIO 312 can be at VIN or 1.8 volts depending on control logic at the en18mode pin. Both VDDIO 312 and VDDQ 313 output supplies are available as long as VIN is available. Switching the VDDIO pin 312 from 1.8 volts to 3.3 volts or vice versa should complete in 5 ms. A dummy load can be turned on during this switching time for quicker settling of the VDDIO 312 and VDDQ 313 voltages. Reliability is especially importance during VDDIO switching. This will be further explained below.

Memory card power supply regulator 211 includes low drop out (LDO) power supply 321. LDO power supply 321 is powered via the 3.3 volt supply received via pin VIN 311 and supplies a 1.8 volt output as controlled by the VIN REF 317 signal. The pin VIN 311 and the pin VIN REF 317 typically have the same voltage and are tied together. Memory card power supply regulator 211 includes two switches: switch S1 322; and switch S2 323. These are switched in the opposite sense. When S1 322 is closed, S2 323 is open; when S1 322 is open, S2 323 is closed. This is controlled by central processing unit 213 via control lines 319 signals en18mode and hhv18. Initially the en18mode and the hhv18 signals select S1 322 closed and S2 323 open. This supplies 3.3 volts from VIN 311 to VDDIQ 312 to power the SD memory card. As illustrated in FIG. 2, VDDIQ 312 also powers SOC I/O circuits 212.

As previously described, central processing unit 213 communicates with SD memory card 220 via SOC I/O circuits 212 to determine a voltage and frequency of their interface. Depending upon the nature of SD memory card 220, central processing unit 213 may continue to supply a 3.3 volt power input to SD memory card 220. In this case central processing unit 213 continues to supply control signals to close switch S1 322 and open switch S2 323. Switch S1 322 connects the input supply VIN 311 (3.3 volts) to the power output to SD memory card 220 at VDDIO 312. Switch S2 323 is open isolating the 1.8 volt output of LDO power supply 321 (VDDQ) from the power output to SD memory card 220 at VDDIQ 313.

In other cases, central processing unit 213 supplies a 1.8 volt power input to SD memory card 220. In this case central processing unit 213 supplies control signals to open switch S1 322 and close switch S2 323. With switch S1 322 open, the output to SD memory card 220 at VDDIO 312 is isolated from VIN 311. With switch S2 323 closed, the output of LDO power supply 321 (VDDQ 313) is connected to the power output to SD memory card 220 at VDDIO 312.

Figure 4:
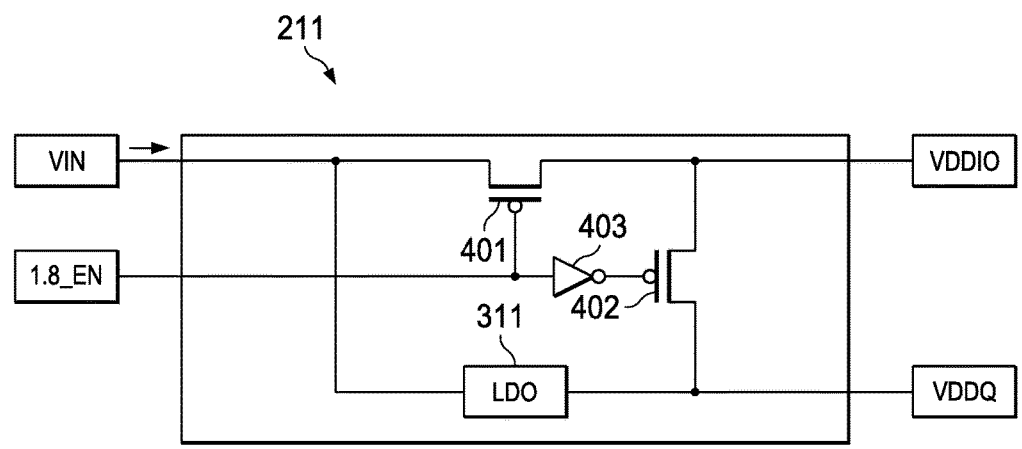
FIG. 4 illustrates another view of the memory card power supply regulator illustrating further details.

This is better illustrated in FIG. 4, showing an exemplary embodiment of switches S1 322 and S2 323. Switch S1 322 is embodied by MOS transistor 401. Transistor 401 has a source-drain path connected between VIN 311 and VDDIO 312. Transistor 401 has a gate receiving a 1.8 volt enable signal (1.8_EN) from central processing unit 213. Switch S2 323 is embodied by transistor 402 and inverter 403. MOS transistor 402 has a source-drain path connected between VDDIO 312 and VDDQ 313. Transistor 402 has a gate receiving a 1.8 volt enable signal (1.8_EN) from central processing unit 213 as inverted by inverter 403. In a first state of 1.8_EN, transistor 401 is conducting and transistor 402 is cut off. Thus the 3.3 volts from VIN 311 supplies VDDIO 312. In a second state of 1.8_EN, transistor 401 is cut off and transistor 402 is conducting. Thus the 1.8 volts from LDO power supply 321 (VDDQ 313) supplies VDDIO 312.

In the preferred embodiment SOC I/O circuits 212 are constructed of transistors designed to operate at 1.8 volts. Ordinarily then, these 1.8 volt transistors would be overstressed and subject to reduced operating life when VDDIO is 3.3 volts. This invention supplies VDDQ 313 from LDO power supply 321 to SOC I/O circuits 212 as a bias voltage. Thus the transistors in SOC I/O circuits 212 never experience the whole 3.3 volt supply and are never overstressed. VDDIO 312 should never exceed VDDQ 313 by more than 2 volts under all conditions including power-up/down sequences. VDDQ 313 and VDDIO 312 should track each other when VDDIO 312 is configured as 1.8 volts. During initial powering of the SD memory card 220 at 3.3 volts, the SOC should delay closing switch S1 302 until LDO power supply 321 brings up the bias at VDDQ. This prevents more than 2 volts applied across the transistor of SOC I/O circuits 212.

Figure 5:
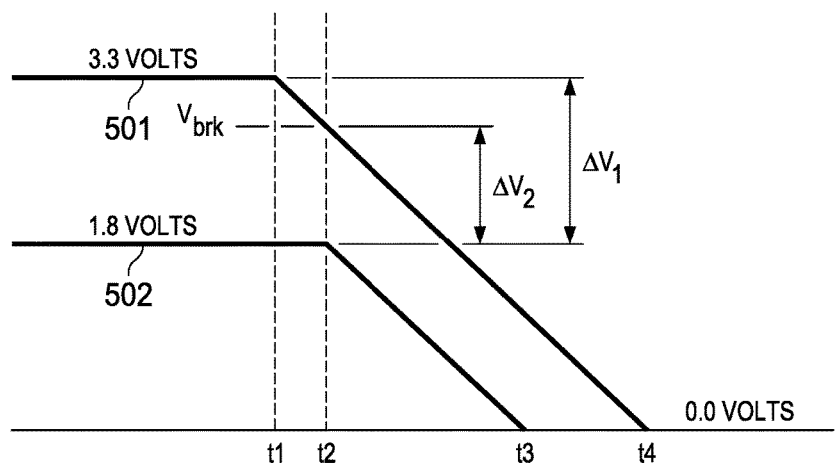
FIG. 5 shows the input voltage supply and the LDO power supply voltage output versus time.

During failure of the 3.3 volt power supply to the system, powering LDO power supply 212 from the 3.3 volt source effectively prevents this overstress. This is illustrated in FIG. 5. FIG. 5 shows the input voltage supply 501 and the LDO power supply 312 voltage output 502. Before time t1, both supplies 501 and 502 are in steady state. The difference between these voltages is $\Delta V_1$, nominally 1.5 volts, which is below the overstress point of the 1.8 volt transistors employed in SOC I/O circuits 212. At time t1, the 3.3 volt supply power is removed. Input voltage supply 501 falls toward 0.0 volts, which it reaches at time t4. At time t1, the output voltage 502 of LDO power supply 211 does not fall immediately due to the regulation character of this power supply. Only after the input voltage supply 501 falls to a voltage $V_{brk}$ at time t2 does output voltage 502 begin to fall. At time t2 the difference between the input voltage supply 501 and the output voltage 502 is $\Delta V_2$. As illustrated in FIG. 5, $\Delta V_2$ is less than $\Delta V_1$, which is below the overstress point of the 1.8 volt transistors employed in SOC I/O circuits 212. These voltages 501 and 502 will tend to drop in parallel until time t3. These voltages will also tend to maintain a voltage difference of $\Delta V_2$. At time t3 voltage 502 is 0.0 volts. However, voltage 501 will be near $\Delta V_2$, a voltage below the overstress point of the 1.8 volt transistors employed in SOC I/O circuits 212. Thus this invention ensures that the 1.8 volt transistors employed in SOC I/O circuits 212 are not overstressed during failure of the 3.3 volt supply. This is achieved by employing the same supply source (VIN 311) for VDDIO 312 and VDDQ 313.

This invention is advantageous over providing an external power supply regulator for the SD memory card. This invention eliminates the need for custom power solution. No software is required in the SOC to support an external power regulator. This eliminates a potential source of design error and delay.

What is claimed is:

1. An integrated circuit (IC) device comprising:
   a first pin;
   a second pin;
   a power supply regulator including:
      a first input coupled to the first pin;
      a first output coupled to the second pin;
      a first electrical signal path extending between the first input of the power supply regulator and the first output of the power supply regulator;
      a voltage regulator having an input and an output, wherein the input of the voltage regulator is coupled to the first input of the power supply regulator to receive a first supply voltage from the first input of the power supply regulator when the first supply voltage is supplied to the first pin, and wherein the voltage regulator outputs a second supply voltage at the output of the voltage regulator when the first supply voltage is received at the input of the voltage regulator;
      a second electrical signal path extending between the output of the voltage regulator and the first output of the power supply regulator;
      a first switching device arranged in the first electrical path; and
      a second switching device arranged in the second electrical path; and
   a controller configured to supply a control signal to a second input of the power supply regulator when the first supply voltage is supplied to the first pin, the control signal causing the first and second switching devices to operate in one of a first mode and a second mode, wherein:
      in the first mode, the first switching device is in a conductive state so that the first input of the power supply regulator and the first output of the power supply regulator are electrically coupled via the first electrical signal path and the second switching device is in a non-conductive state so that the output of the voltage regulator and the first output of the power supply regulator are electrically isolated via the second electrical signal path; and
      in the second mode, the first switching device is in a non-conductive state so that the first input of the power supply regulator and the first output of the power supply regulator are electrically isolated via the first electrical signal path and the second switching device is in a conductive state so that the output of the voltage regulator and the first output of the power supply regulator are electrically coupled via the second electrical signal path;

wherein the first output of the power supply regulator outputs an output voltage to the second pin, wherein the output voltage is the first supply voltage when the control signal causes the first and second switching devices to operate in the first mode and is the second supply voltage when the control signal causes the first and second switching devices to operate in the second mode.

2. The IC device of claim 1, wherein the first supply voltage and the second supply voltage are different.

3. The IC device of claim 2, wherein the second supply voltage is less than the first supply voltage.

4. The IC device of claim 3, wherein:
the first supply voltage is 3.3 volts; and
the second supply voltage is 1.8 volts.

5. The IC device of claim 1, wherein the voltage regulator is a low dropout voltage regulator.

6. The IC device of claim 1, wherein the voltage regulator and the first electrical signal path are arranged in parallel between the first input of the power supply regulator and the first output of the power supply regulator.

7. The IC device of claim 1, wherein the first switching device is a first metal oxide semiconductor (MOS) transistor and the second switching device is a second MOS transistor.

8. The IC device of claim 7, wherein the first and second MOS transistors have the same conductivity type.

9. The IC device of claim 8, wherein the first switching device has a control terminal to receive the control signal and wherein the second switching device has a control terminal to receive the inverse of the control signal.

10. The IC device of claim 1, wherein the first pin is a first bond pad of the IC device and the second pin is a second bond pad of the IC device.

11. The IC device of claim 1, comprising input/output (I/O) circuitry having a first input to receive the second supply voltage from the voltage regulator and a second input to receive the output voltage supplied to the second pin.

12. The IC device of claim 11, wherein:
the I/O circuitry comprises a plurality of transistors, the transistors having a normal operating voltage range that includes the second supply voltage but not the first supply voltage, wherein the transistors are overstressed when operating based on the first supply voltage but are not overstressed when operating based on the second supply voltage; and
when the control signal causes the first and second switching devices to operate in the first mode, the output voltage is the first supply voltage and the transistors operate based on an operating voltage obtained by biasing the first supply voltage by the second supply voltage, wherein the operating voltage is less than the first supply voltage.

13. The IC device of claim 12, when the control signal causes the first and second switching devices to operate in the first mode, the operating voltage is within the normal operating voltage range of the transistors of the I/O circuitry.

14. An electronic system comprising:
an interface configured to provide a connection to an external device;
an integrated circuit (IC) device comprising:
a first pin;
a second pin coupled to the interface;
a power supply regulator including:
a first input coupled to the first pin;
a first output coupled to the second pin;
a first electrical signal path extending between the first input of the power supply regulator and the first output of the power supply regulator;
a voltage regulator having an input and an output, wherein the input of the voltage regulator is coupled to the first input of the power supply regulator to receive a first supply voltage from the first input of the power supply regulator when the first supply voltage is supplied to the first pin, and wherein the voltage regulator outputs a second supply voltage at the output of the voltage regulator when the first supply voltage is received at the input of the voltage regulator;
a second electrical signal path extending between the output of the voltage regulator and the first output of the power supply regulator;
a first switching device arranged in the first electrical path; and
a second switching device arranged in the second electrical path; and
a controller configured to supply a control signal to a second input of the power supply regulator when the first supply voltage is supplied to the first pin, the control signal causing the first and second switching devices to operate in one of a first mode and a second mode, wherein:
in the first mode, the first switching device is in a conductive state so that the first input of the power supply regulator and the first output of the power supply regulator are electrically coupled via the first electrical signal path and the second switching device is in a non-conductive state so that the output of the voltage regulator and the first output of the power supply regulator are electrically isolated via the second electrical signal path; and
in the second mode, the first switching device is in a non-conductive state so that the first input of the power supply regulator and the first output of the power supply regulator are electrically isolated via the first electrical signal path and the second switching device is in a conductive state so that the output of the voltage regulator and the first output of the power supply regulator are electrically coupled via the second electrical signal path;
wherein the first output of the power supply regulator outputs an output voltage to the second pin, wherein the output voltage is the first supply voltage when the control signal causes the first and second switching devices to operate in the first mode and is the second supply voltage when the control signal causes the first and second switching devices to operate in the second mode.

15. The electronic system of claim 14, wherein the external device is an external memory card, and wherein the interface is configured to connect to input/output terminals of the external memory card.

16. The electronic system of claim 15, wherein the external memory card is a secure digital (SD) memory card.

17. The electronic system of claim 14, wherein the first supply voltage is greater than the second supply voltage.

18. The electronic system of claim 17, wherein the first supply voltage is 3.3 volts, and wherein the second supply voltage is 1.8 volts.

19. The electronic system of claim 14, when the interface is connected to the external device, a determine of whether the control signal causes the first and second switching devices to operate in the first mode or in the second mode is based at least partially on the type of external device connected to the interface.

\* \* \* \* \*